Figure 1:
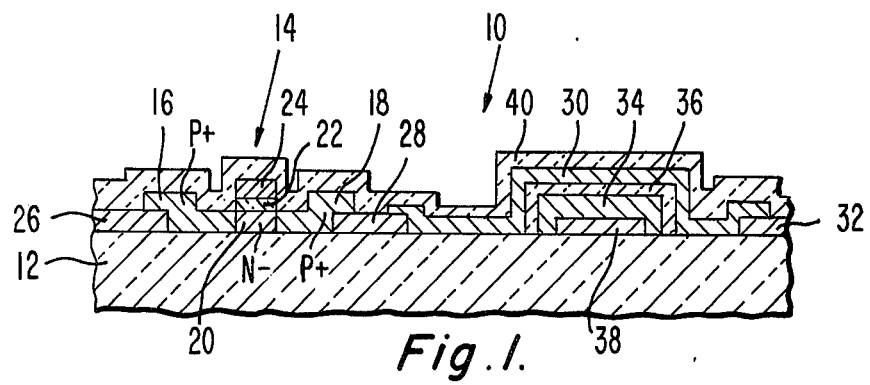

United States Patent [19]

Ipri et al.

[11] 4,119,992
[45] Oct. 10, 1978

[54] INTEGRATED CIRCUIT STRUCTURE AND METHOD FOR MAKING SAME

[75] Inventors: Alfred Charles Ipri; Joseph Hurlong Scott, Jr., both of Princeton, N.J.

[73] Assignee: RCA Corp., New York, N.Y.

[21] Appl. No.: 791,945

[22] Filed: Apr. 28, 1977

[51] Int. Cl.² ............................................ H01L 27/12
[52] U.S. Cl. ............................................ 357/4; 357/23; 357/41
[58] Field of Search ................................ 357/4, 23, 41

[56] References Cited

U.S. PATENT DOCUMENTS

| 3,852,563 | 12/1974 | Bohorquez et al. | 357/4 |
| 3,872,359 | 3/1975 | Feuersanger | 357/4 |
| 3,872,492 | 3/1975 | Robbins | 357/4 |
| 3,933,529 | 1/1976 | Goser | 357/4 |

Primary Examiner—Edward J. Wojciechowicz
Attorney, Agent, or Firm—H. Christoffersen; Sanford J. Asman

[57] ABSTRACT

The integrated circuit is manufactured upside down relative to conventional silicon-on-sapphire (SOS) processing techniques for manufacturing field effect transistors. First a conductive pattern, typically of a refractory metal, is deposited and defined on an insulating substrate, such as sapphire, and then silicon transistors are formed over the conductive pattern. Using the process, a masking step, namely the contact definition mask, used in conventional SOS manufacture, is eliminated.

9 Claims, 5 Drawing Figures

INTEGRATED CIRCUIT STRUCTURE AND METHOD FOR MAKING SAME

The present invention relates to the manufacture of integrated circuit devices. In particular, the invention relates to the manufacture of SOS field effect transistor integrated circuits.

In the conventional manufacturing of integrated circuits employing field effect transistors on a sapphire substrate, one starts with single crystal aluminum oxide ($Al_2O_3$), called sapphire, on which a silicon epitaxial layer is grown. The epitaxial layer is defined into islands which are covered with an oxide layer. Polycrystalline silicon gates are deposited and defined over the gate oxide layer and then source and drains are formed either by diffusion or ion implantation. In order to contact the source and drain of a conventionally formed SOS transistor a photomask must be used to define openings in the oxide layer for metal contact deposition.

In view of the fact that the yield of semiconductor devices is inversely proportional to the number of masking steps which are used in the manufacture of the devices, and further in view of the processing required to form a contact opening and the problem associated with the step formed in the metallization by the oxide coating overlying the source and drain of the transistor, a process which would provide planar metallization layers and which would simultaneously eliminate the need for a masking step would be desirable.

IN THE DRAWINGS

FIG. 1 is a cross sectional view of a portion of an integrated circuit structure formed by the method of the present invention; and FIGS. 2-5 illustrate the method of forming the structure of FIG. 1.

Referring now to FIG. 1, a portion of an integrated circuit structure 10 is shown. The structure 10 comprises a substrate 12 of insulating material such as single crystal aluminum oxide ($Al_2O_3$), i.e. sapphire. Other materials such as spinel may be substituted as a substrate material. Overlying the substrate 12 there is at least one conductor-insulator-semiconductor (CIS) field effect transistor (FET) 14 which in this example is a P channel device which comprises a P+ source region 16, a P+ drain region 18, and an N− channel region 20 formed therebetween. Overlying the channel region 20 is an insulating layer 22 over which a conductive gate 24 lies. In the present embodiment, the gate 24 is a polycrystalline silicon gate. Contact is made to the drain 16 and to the source region 18 via conductors 26, 28, respectively, which in the present embodiment are comprised of a refractory metal such as tungsten or molybdenum but which may be any metal having a melting point such that the metal will not melt during the processing of the structure as explained hereinafter. A polycrystalline silicon conductor 30 is shown to be separated from a polycrystalline silicon conductor 34 by an insulating layer 36, which in the present embodiment is comprised of silicon dioxide. The silicon conductive layer 34 makes contact to yet another refractory metal conductor 38 which tunnels under the insulating layer 36. Overlying the portion of the integrated structure 10 is a protective oxide layer 40.

Figure 2:
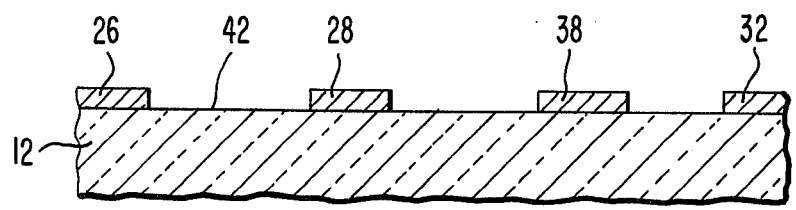

Referring to FIG. 2, one manufactures the integrated circuit structure 10 by starting with an insulating substrate 12 on which a semiconductor layer can be epitaxially grown as a single crystal.

On a surface 42 of the substrate 12 a layer of refractory metal such as tungsten or molybdenum or any other material with an adequately high melting point is applied by any suitable method. For example, metal may be applied by either evaporation, sputtering or chemical vapor deposition (CVD). In a CVD process for applying tungsten, which is the metal used in the preferred embodiment of the present invention, tungsten is deposited by the pyrolytic decomposition of tungsten hexafluoride ($WF_6$) in an atmosphere which is inert for that purpose, such as hydrogen gas, at about 600° C. After applying the tungsten layer, a layer of photoresist (not shown) is applied over the layer and a first photomask is used to define conductors 26, 28, 38 and 32, and the balance of the tungsten layer is removed by etching with potassium hydroxide (KOH) and potassium ferricyanide ($K_3Fe(CN)_6$). Then, the balance of the photoresist layer is removed.

Figure 3:
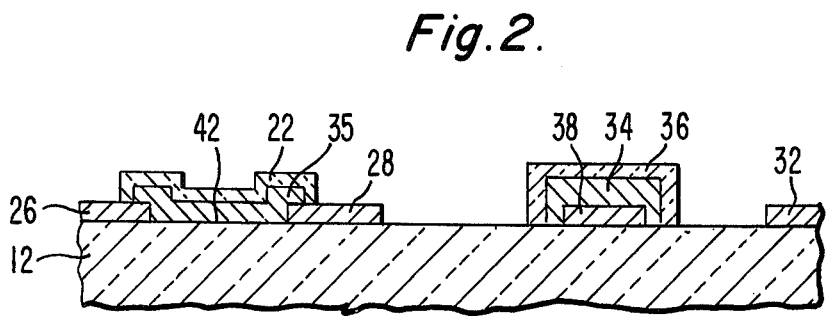

Referring now to FIG. 3, one next places the substrate 12 into a reactor where silicon is deposited by the pyrolytic decomposition of silane ($SiH_4$) in hydrogen ($H_2$) at 1000° C. Because of the presence of both the sapphire surface 42, on which single crystal silicon can grow epitaxially, and the tungsten conductors 26, 28, 38 and 32, on which polycrystalline silicon can grown, the layer formed by the decomposition of silane will be single crystal silicon over the sapphire surface 42 but will be polycrystalline on and adjacent the tungsten conductors 26, 28, 38 and 32.

In the preferred embodiment of the invention the deposited layer of silicon is doped with donor impurities, such as phosphorus, so that the layer formed will have about $2 \times 10^{15}$ donor impurities/cc. The silicon layer is grown to a thickness of about 6000Å. A layer of photoresist is deposited over the silicon layer thus formed, and using a second photomask (not shown) the silicon layer is defined into regions which will become polycrystalline silicon conductors, which overlie metal conductors, such as region 34 and regions which will become CIS field effect transistors, such as region 35.

Next, the substrate 12 is placed into a reactor, heated to about 900° C. in steam and a small quantity of HCl to grow a layer of silicon dioxide over the silicon layers 34, 35. The silicon dioxide layers 22, 36 will grow to a thickness of about 1000Å in about 50 minutes.

Figure 4:
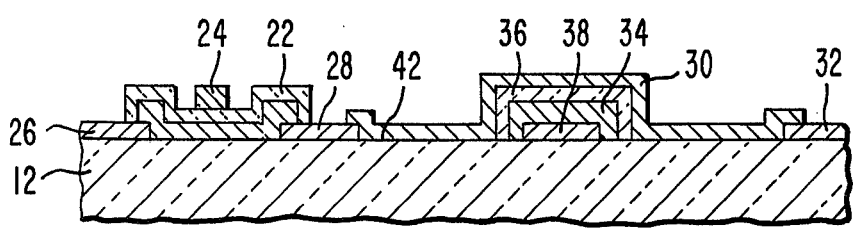

Referring now to FIG. 4, the substrate 12 is next placed into a deposition reactor heated to between about 700° C. and 1000° C. to deposit a layer of silicon over the oxide layers 22 and 36 and over the exposed portions of the surface 42 of the substrate and over the exposed portions of the metal conductors 26, 28 and 32. If the temperature is on the order of about 700° C. only polycrystalline silicon will be deposited. A layer of photoresist (not shown) is deposited over the polycrystalline silicon layer and the polycrystalline silicon layer is defined using a third photomask (not shown). Then, the defined polycrystalline silicon layer is etched and the balance of photoresist material is removed in order to form the gate 24 and the polycrystalline conductor 30.

Using the polycrystalline silicon gate 24 as a mask, the portions of the oxide layer 22 which do not underlie the layer 24 are removed by etching in a solution of KOH and N-proponal.

Figure 5:
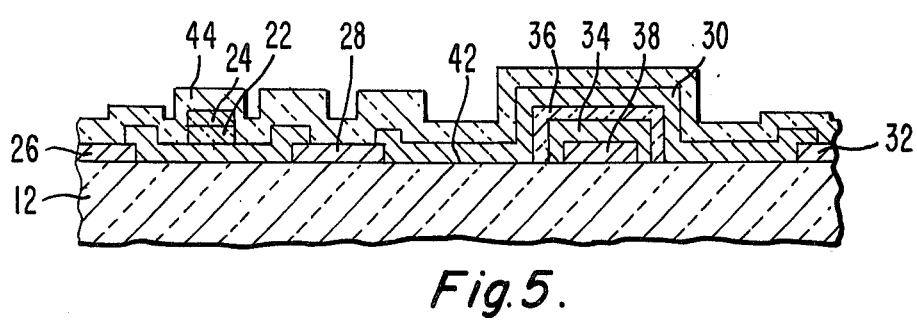

Referring to FIG. 5, an oxide layer which is doped with an acceptor impurity, such as boron, in order to form P channel transistors, or with a donor impurity such as phosphorus, in order to form N channel transistors, is deposited over the surface of the substrate. In order to manufacture the structure 10 shown in FIG. 1, a boron doped oxide layer 44 is deposited over the entire surface of the substrate.

If only devices of one polarity, i.e. only P channel devices, are to be formed, the wafer is then placed in a diffusion furnace to drive impurities from the layer 44 into the layer 35 thereby forming the P+ source and P+ drain 18 as shown in FIG. 1.

If complementary symmetry devices are to be formed, the boron doped oxide layer 44 is defined using a layer of photoresist and a photomask, and then a phosphorus or other doped oxide layer is deposited over those transistors which are to be N-channel. Then the drive-in diffusion takes place.

Following the drive-in diffusion, the oxide layer 44 may be stripped and a clean oxide layer 40 is formed over the entire surface of the substrate 12. Pad openings are defined in the oxide layer 40 by a fourth photomask (fifth photomask in the case of complementary devices), thereby completing the structure 10.

The manufacture of semiconductor integrated circuit structures in accordance with the present invention does not require a metal contact opening mask. Also, the metal conductive layers are formed directly over the planar surface 42 of the sapphire substrate which means that the problem of stepped metallization is eliminated. By eliminating the stepped metallization, narrower metal spacings can be used than would otherwise be required in the conventional manufacturing of devices. Therefore, smaller devices can be made.

We claim:

1. An integrated circuit structure comprising:
   (a) a body of insulating material having a surface on which a single crystal semiconductor material may be epitaxially grown;
   (b) at least one pair of spaced conductors on the surface of said body; and
   (c) at least one semiconductor device formed of a single crystal semiconductor material epitaxially grown on said insulating material comprising:
      (i) a pair of spaced semiconductor regions having a first conductivity type formed on the surface of said body, one of said spaced semiconductor regions at least partially overlying one of said pair of spaced conductors and the other of said spaced semiconductor regions at least partially overlying the other of said pair of spaced conductors;
      (ii) a channel region comprising a single crystal semiconductor region lying between and adjacent to each of said spaced semiconductor regions, said channel region overlying said surface of said body;
      (iii) an insulating region overlying said channel region; and
      (iv) a conductive gate region overlying said insulating region.

2. The integrated circuit structure of claim 1 wherein said channel region is of opposite conductivity type to said pair of spaced semiconductor regions.

3. The integrated circuit structure of claim 1 wherein said channel region is of the same conductivity type as said pair of spaced semiconductor regions but has a lower impurity concentration.

4. The integrated circuit structure of claim 1 wherein said pair of spaced conductors are comprised of a metal.

5. The integrated circuit structure of claim 4 wherein said metal is a refractory metal and has a melting point greater than 1000° C.

6. The integrated circuit structure of claim 1 wherein said gate region is comprised of a conductive semiconductive material.

7. The integrated circuit structure of claim 6 wherein said gate region is comprised of polycrystalline silicon.

8. The integrated circuit structure of claim 1 which further comprises at least one additional conductor on the surface of said body.

9. The integrated circuit structure of claim 8 further comprising an insulating layer overlying said additional conductor and another conductive layer overlying said insulating layer.

* * * * *